US010768035B2

(12) United States Patent
Seiler et al.

(10) Patent No.: US 10,768,035 B2
(45) Date of Patent: Sep. 8, 2020

(54) RADAR-FILL-LEVEL MEASURING DEVICE

(71) Applicant: Endress + Hauser GmbH + Co. KG, Maulburg (DE)

(72) Inventors: Christian Seiler, Neuenburg (DE); Thomas Blodt, Steinen (DE); Jorg Fuglistaller, Widen (CH)

(73) Assignee: ENDRESS+HAUSER SE+CO.KG, Maulburg (DE)

( * ) Notice: Subject to any disclaimer, the term of this patent is extended or adjusted under 35 U.S.C. 154(b) by 296 days.

(21) Appl. No.: 15/747,198

(22) PCT Filed: Jul. 26, 2016

(86) PCT No.: PCT/EP2016/067727
§ 371 (c)(1),
(2) Date: Jan. 24, 2018

(87) PCT Pub. No.: WO2017/025313
PCT Pub. Date: Feb. 16, 2017

(65) Prior Publication Data
US 2018/0216984 A1  Aug. 2, 2018

(30) Foreign Application Priority Data
Aug. 11, 2015 (DE) .................. 10 2015 113 224

(51) Int. Cl.
*G01F 23/284* (2006.01)
*G01S 13/88* (2006.01)
(Continued)

(52) U.S. Cl.
CPC .............. *G01F 23/284* (2013.01); *G01S 7/03* (2013.01); *G01S 7/032* (2013.01); *G01S 13/88* (2013.01);
(Continued)

(58) Field of Classification Search
CPC .......... G01F 23/284; G01S 13/88; G01S 7/03; G01S 7/032; H01Q 13/02; H01Q 13/24; H01Q 1/1221; H01Q 1/225
See application file for complete search history.

(56) References Cited

U.S. PATENT DOCUMENTS

2011/0158344 A1  6/2011  Kawamura et al.
2012/0262247 A1* 10/2012  Schulz .................. H01P 5/107
                                                                333/26

FOREIGN PATENT DOCUMENTS

CN    102150324 A    8/2011
CN    102769166 A   11/2012
(Continued)

OTHER PUBLICATIONS

Chinese Office Action in corresponding Chinese Application No. 201680046901.1, dated Apr. 25, 2019.
(Continued)

*Primary Examiner* — Timothy A Brainard
(74) *Attorney, Agent, or Firm* — Bacon & Thomas, PLLC

(57) ABSTRACT

A radar fill-level measuring device for measuring a fill level of a fill substance in a container using the travel time principle, comprising a circuit board with a sending/receiving system for sending and receiving high-frequency radar waves, wherein the circuit board has at least two openings, a hollow conductor having at least two lateral edge projections, wherein lengths of the at least two projections are greater than the thickness of the circuit board, wherein the at least two projections are led through the at least two openings, so that the at least two projections extend partially out from a second side of the circuit board, a lid, which is secured to parts of the at least two projections, which extend out from the second side of the circuit board, such that the hollow conductor is secured to the circuit board by means of the lid.

9 Claims, 2 Drawing Sheets

(51) Int. Cl.
*H01Q 1/22* (2006.01)
*G01S 7/03* (2006.01)
*H01Q 1/12* (2006.01)
*H01Q 13/24* (2006.01)
*H01P 3/12* (2006.01)
*H01Q 13/02* (2006.01)
*H05K 1/02* (2006.01)
*H01P 5/107* (2006.01)

(52) U.S. Cl.
CPC ............. *H01P 3/12* (2013.01); *H01Q 1/1221* (2013.01); *H01Q 1/225* (2013.01); *H01Q 13/02* (2013.01); *H01Q 13/24* (2013.01); *H05K 1/024* (2013.01); *H05K 1/0243* (2013.01); *H01P 5/107* (2013.01); *H05K 2201/015* (2013.01); *H05K 2201/0158* (2013.01); *H05K 2201/10098* (2013.01)

(56) References Cited

FOREIGN PATENT DOCUMENTS

| | | |
|---|---|---|
| CN | 203848907 U | 9/2014 |
| DE | 11 2004 001 988 T5 | 12/2006 |
| DE | 10 2005 054 233 A1 | 5/2007 |
| DE | 10 2011 015 894 A1 | 10/2012 |
| DE | 10 2014 207 148 A1 | 10/2015 |
| DE | 10 2015 113 224 A1 | 2/2017 |
| EP | 2 506 363 A1 | 10/2012 |
| JP | 6-140801 A | 5/1994 |
| WO | WO 0120273 A1 | 3/2001 |
| WO | 2005/038414 A1 | 4/2005 |
| WO | 2017/025313 A1 | 2/2017 |

OTHER PUBLICATIONS

German Search Report, German PTO, Munich, Jun. 14, 2016.
International Search Report, EPO, The Netherlands, Nov. 14, 2016.
Chinese Office Action dated May 28, 2020 in corresponding Chinese Patent Application No. 201680046901.1.

* cited by examiner

RADAR-FILL-LEVEL MEASURING DEVICE

TECHNICAL FIELD

The invention relates to a radar fill-level measuring device for measuring a fill level of a fill substance in a container using the travel time principle.

BACKGROUND DISCUSSION

In the fill level measurement, microwaves are sent by means of an antenna toward the surface of a fill substance and the echo waves reflected on the surface received. An echo function representing the echo amplitudes as a function of distance is formed, from which the probable wanted echo and its travel time are determined. From the travel time, the separation between the surface of the fill substance and the antenna is determined.

In industrial measurements technology, dielectric rod antennas and horn antennas are regularly applied for the sending and/or receiving. Typically, a housing is used, which has a housing section, which possesses the geometry of a short-circuited hollow conductor.

Inserted in the housing section with the hollow conductor geometry is a coupling element, via which microwaves are sent and/or received from and by the housing section. The microwaves for the sending are produced by a remotely arranged microwave generator and transported via coaxial lines to a sending/receiving system. In the antenna, there occurs via the sending/receiving system a changing from supplied, wire-transported microwaves into microwaves, which propagate in free space, and vice versa.

For determining the fill level, all known methods can be applied, which enable relatively short distances to be measured by means of reflected microwaves. The most common examples are pulse radar and frequency modulated, continuous wave radar (FMCW radar).

(Published international Application), WO01/88488 A1 describes (see the present FIG. 1) a fill-level measuring device having a rod antenna 35. The rod antenna 35 includes a cylindrical hollow conductor 39, which is short-circuited on one end by means of a rear wall 37. The fill-level measuring device includes a circuit board 49, on which a microwave generator 45 is located. Circuit board 49 includes a section 51, which protrudes laterally into the rod antenna 35 through an opening 52 in the hollow conductor 39. Section 51 is arranged parallel to the rear wall 37 and spaced from such. The sending/receiving element 47 is arranged on the section 51 protruding into the rod antenna 35.

The separation between the sending/receiving element and the rear wall must lie in a certain value range. Such value range depends decisively on the wavelength of the microwaves. Disadvantageous in a fill-level measuring device known from the state of the art (see the present FIG. 1) is that, in the course of time or in the course of the casting of the housing, the circuit board can shift and the sending/receiving element can change its separation from the rear wall. This can lead to destructive interference and, thus, to low intensity, radiated microwaves, whereby the accuracy of measurement of the fill-level measuring device is degraded.

SUMMARY OF THE INVENTION

An object of the invention is to provide a fill-level measuring device, which ascertains exact values for the fill level.

The object is achieved by the subject matter of the invention. The subject matter of the invention is a radar fill-level measuring device for measuring a fill level of a fill substance in a container using the travel time principle, comprising a circuit board with a sending/receiving system for sending and receiving high-frequency radar waves and an evaluation unit for determining travel time of radar waves reflected from a surface of the fill substance, wherein the circuit board has at least two openings, wherein the sending/receiving system has a coupling element for out- and in-coupling of radar waves, wherein an end of the coupling element is arranged on a first side of the circuit board centrally between the at least two openings, a hollow conductor with at least two lateral edge projections, which are embodied as a lengthening of an end of the hollow conductor parallel to the longitudinal axis of the hollow conductor, wherein lengths of the at least two projections are greater than the thickness of the circuit board, wherein the at least two projections are led through the at least two openings, such that the at least two projections extend partially out from a second side of the circuit board, a lid, which is secured to parts of the at least two projections, which extend out from the second side of the circuit board, such that the hollow conductor is secured to the circuit board by means of the lid.

A radar fill-level measuring device of the invention is simpler to assemble than that known from the state of the art. Moreover, in the assembled state, the circuit board is immovable relative to the hollow conductor and relative to the lid and does not, in the course of time, change its separation from the lid. If the separation between the coupling element on the circuit card and the rear wall amounts to a whole numbered multiple of half the wavelength of the produced radar waves, the intensity of the radar waves is maximum and, thus, the accuracy of measurement of the radar fill-level measuring device is maximum also.

In an advantageous further development, the hollow conductor is embodied as a horn radiator.

In an advantageous variant, the hollow conductor communicates with a horn radiator at an end lying opposite the circuit board.

In an advantageous form of embodiment, the lid includes at least two cavities, wherein the at least two cavities are embodied in such a way that the at least two cavities enter into a shape interlocking connection with parts of the at least two projections extending out from the second side of the circuit board.

In an advantageous embodiment, the lid is embodied congruently with a surface of the circuit board and with parts of the at least two projections, which extend out from the second side of the circuit board, so that radar waves do not escape to the outside of the hollow conductor or the lid.

In an advantageous further development, includes the hollow conductor a circularly shaped, elliptical, rectangular or square cross section.

BRIEF DESCRIPTION OF THE DRAWINGS

The invention will now be explained in greater detail based on the appended drawing, the figures of which show as follows.

DETAILED DISCUSSION IN CONJUNCTION WITH THE DRAWINGS

Figure 2:
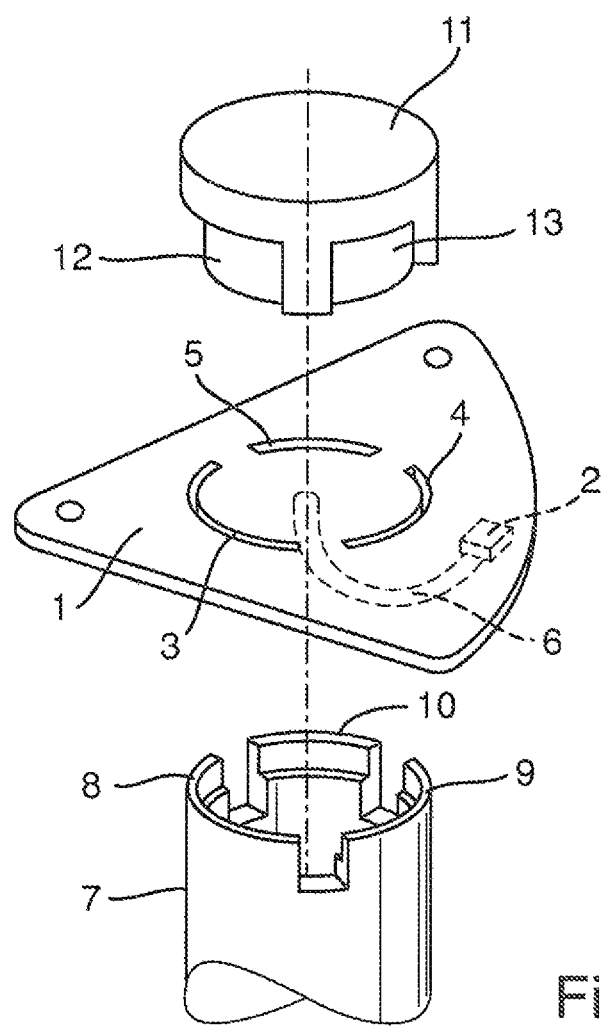
FIG. 2 is a schematic, exploded view of a radar fill-level measuring device of the invention, in the case of which the hollow conductor is mounted on a circuit board.

FIG. 2 shows a schematic, exploded view of the portion of a radar fill-level measuring device relating to the invention for measuring a fill level of a fill substance in a container using the travel time principle. The radar fill-level measuring device includes a circuit board 1, on which are arranged a sending/receiving system 2 for sending and receiving high-frequency radar waves and an evaluation unit (not shown) for determining the travel time of the radar waves reflected from a surface of the fill substance. The circuit board 1 includes three openings 3, 4, 5, which are elongated and extend curved in such a way on the circuit card 1 that they form a circle. The sending/receiving system 2 includes a coupling element 6 for out- and in-coupling of radar waves, which is likewise arranged on the circuit board 1. A free end of the coupling element 6 is arranged on a first side of the circuit board 1 centrally between the three openings 3, 4, 5.

A hollow conductor 7 of the radar fill-level measuring device includes three lateral edge projections 8, 9, 10, which are embodied as a lengthening of an end of the hollow conductor 7 parallel to the longitudinal axis of the hollow conductor 7. The lengths of the three projections 8, 9, 10 are greater than the thickness of the circuit board 1. The three projections 8, 9, 10 can be led through the three openings 3, 4, 5, so that the three projections 8, 9, 10 extend partially out from a second side of the circuit board 1.

A lid 11 includes on an end three lateral edge cavities 12, 13 (the third cavity is not shown). The three cavities 12, 13 of the lid 11 are embodied in such a way that they can enter into a shape interlocking connection with the three projections 8, 9, 10 of the hollow conductor 7.

The assembly of the radar fill-level measuring device occurs in the following way. First, the three projections 8, 9, 10 of the hollow conductor 7 are led through the openings 3, 4, 5 of the circuit board 1, until a part of the projections 8, 9, 10 protrudes out on an oppositely lying side of the circuit board 1. Then, the lid 11 is pushed on the second side of the circuit board into the protruding out parts of the projections 8, 9, 10, until the three cavities 12, 13 of the lid 11 enter into a shape interlocking connection with the three projections 8, 9, 10 of the hollow conductor 7.

Figure 1:
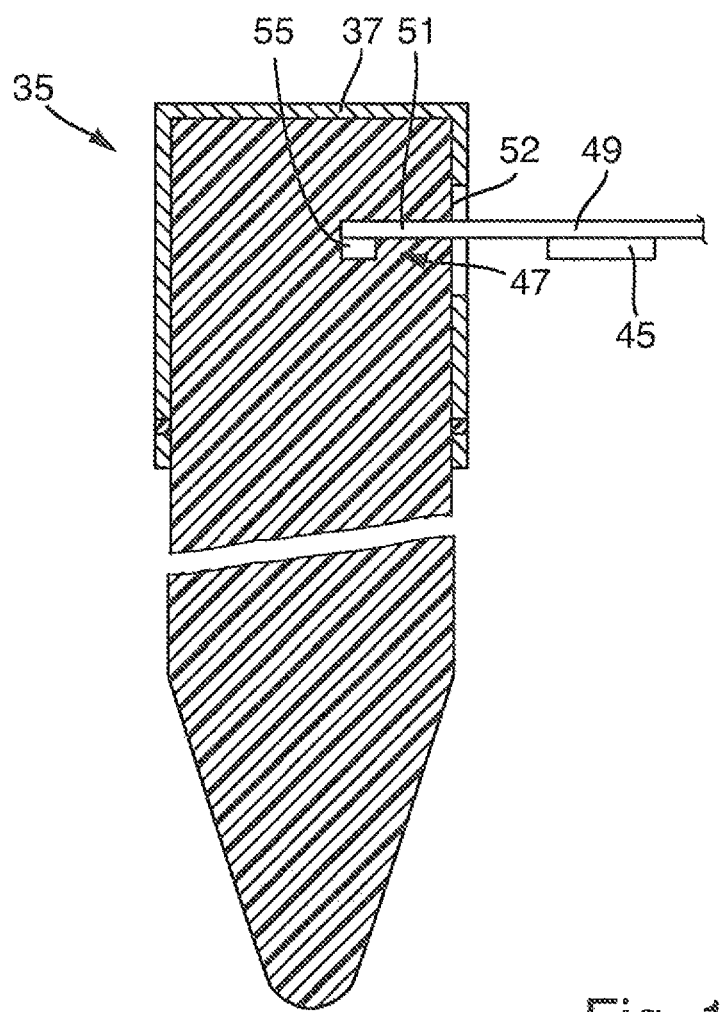
FIG. 1 is a schematic representation of a radar fill-level measuring device according to the state of the art, in the case of which the sending/receiving unit has a microstrip sending line extending perpendicularly to the sending direction.
Figure 3:
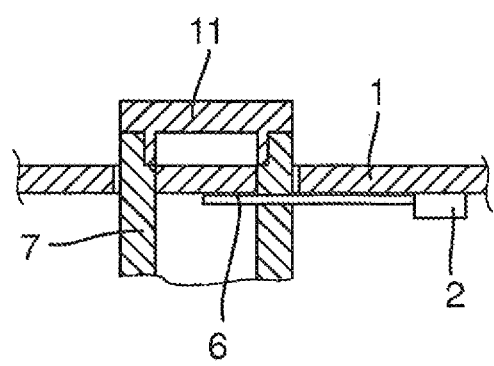
FIG. 3 is a schematic, side view of a mounted radar fill-level measuring device of FIG. 2.

FIG. 3 shows, in a view corresponding to FIG. 1, the assembled radar fill-level measuring device of the invention.

The invention claimed is:

1. A radar fill-level measuring device for measuring a fill level of a fill substance in a container using the travel time principle, comprising:
   a circuit board with a sending/receiving system for sending and receiving high-frequency radar waves and an evaluation unit for determining travel time of the radar waves reflected from a surface of the fill substance, said circuit board has at least two openings, wherein said sending/receiving system has a coupling element for out- and in-coupling of radar waves, an end of said coupling element is arranged on a first side of said circuit board centrally between said at least two openings;
   a hollow conductor with at least two lateral edge projections, which are embodied as a lengthening of an end of said hollow conductor parallel to the longitudinal axis of said hollow conductor, wherein lengths of said at least two lateral edge projections are greater than the thickness of said circuit board, and wherein said at least two lateral edge projections are led through said at least two openings, so that said at least two lateral edge projections extend partially out from a second side of said circuit board and
   a lid, which is secured to parts of said at least two lateral edge projections, which extend out from the second side of said circuit board, such that said hollow conductor is secured to said circuit board by means of said lid.

2. The radar fill-level measuring device as claimed in claim 1, wherein:
   said hollow conductor is embodied as a horn radiator.

3. The radar fill-level measuring device as claimed in claim 1, wherein:
   said hollow conductor communicates with a horn radiator at an end lying opposite said circuit board.

4. The radar fill-level measuring device as claimed in claim 1, wherein:
   said lid includes at least two cavities; and
   said at least two cavities are embodied in such a way that the at least two cavities enter into a shape interlocking connection with parts of said at least two projections extending out from the second side of said circuit board.

5. The radar fill-level measuring device as claimed in claim 4, wherein:
   said lid is embodied congruently with a surface of said circuit board and with parts of the at least two projections, which extend out from the second side of said circuit board, so that radar waves do not escape to the outside of said hollow conductor or said lid.

6. The radar fill-level measuring device as claimed in claim 1, wherein:
   said hollow conductor has a circularly shaped, elliptical, rectangular or square cross section.

7. The radar fill-level measuring device as claimed in claim 1, wherein:
   said circuit board is constructed of at least two plies;
   at least one of said two plies is composed of a low loss material for high-frequency waves.

8. The radar fill-level measuring device as claimed in claim 7, wherein:
   said low loss material for high-frequency waves is PEEK, PTFE, PP, PE or Teflon ceramic.

9. The radar fill-level measuring device as claimed in claim 7, wherein:
   said at least one of said two plies faces in the direction of said hollow chamber.

* * * * *